United States Patent [19]

Takahama

[11] Patent Number: 4,569,084

[45] Date of Patent: Feb. 4, 1986

[54] FREQUENCY CONVERTER, ESPECIALLY CATV CONVERTER

[75] Inventor: Masaaki Takahama, Mie, Japan

[73] Assignee: NEC Kansai, Ltd., Otsu, Japan

[21] Appl. No.: 614,834

[22] Filed: May 29, 1984

[30] Foreign Application Priority Data

| Jun. 14, 1983 | [JP] | Japan | 58-91288[U] |
| Jun. 14, 1983 | [JP] | Japan | 58-91289[U] |
| Jun. 15, 1983 | [JP] | Japan | 58-92386[U] |
| Jun. 15, 1983 | [JP] | Japan | 58-92387[U] |
| Jun. 24, 1983 | [JP] | Japan | 58-98264[U] |
| Jul. 14, 1983 | [JP] | Japan | 58-109326[U] |
| Jul. 25, 1983 | [JP] | Japan | 58-115412[U] |
| Jul. 28, 1983 | [JP] | Japan | 58-181556 |

[51] Int. Cl.⁴ .............................................. H04B 1/26
[52] U.S. Cl. .................................... 455/131; 455/189; 455/301; 455/315
[58] Field of Search .................. 455/131, 189–191, 455/300, 301, 314, 315, 316, 349

[56] References Cited

U.S. PATENT DOCUMENTS

| 3,643,168 | 2/1972 | Manicki | 455/300 |
| 4,214,212 | 7/1980 | Dipietromaria | 455/190 |
| 4,352,209 | 9/1982 | Ma | 455/315 |
| 4,353,132 | 10/1982 | Saitoh et al. | 455/315 |
| 4,494,095 | 1/1985 | Noji et al. | 455/349 |

Primary Examiner—Jin F. Ng
Attorney, Agent, or Firm—W. G. Fasse; D. H. Kane, Jr.

[57] ABSTRACT

A CATV converter of a dual frequency conversion type is constructed in a chassis divided into compartments for accommodating respective stages between the input and output terminals. The primary and secondary local oscillators are disposed apart with other compartments interposed therebetween thereby to enhance the input to output isolation.

12 Claims, 13 Drawing Figures

FREQUENCY CONVERTER, ESPECIALLY CATV CONVERTER

FIELD OF THE INVENTION

The present invention relates to a frequency converter for high frequency signals and, particularly, to an up-down CATV (cable television) converter for a double superheterodyne system.

DESCRIPTION OF THE PRIOR ART

A CATV converter is a high-frequency signal processor for converting frequencies of television signals transmitted over transmission lines, into a certain intermediate frequency (IF). One example of a CATV converter is used for converting frequencies of multi-channel CATV signals allocated in the VHF band to the frequency of an unused channel for wireless broadcasting, so that the CATV signals can be received by television sets designed for wireless TV broad-casting. This type of CATV converter employs a double superheterodyne system in which the input signal of the VHF band is up-converted into the UHF band to produce a UHF-IF signal, which is then down-converted into the VHF band to produce a VHF-IF signal on the desired channel. A typical known example is the up-down frequency converter for CATV as disclosed in U.S. Pat. No. 4,352,209. This CATV converter operates so that television signals channeled in the VHF band of about 50 MHz to about 450 MHz and sent over transmission lines are frequency converted to match the desired, unused channel of an ordinary wireless television receiver. The converter is used as a front-end unit of the tuner in ordinary wireless television sets. In the signal processing by the converter, CATV signals having carriers in the range of 54–440 MHz are provided by the primary conversion in which the selected channel is up-converted with the first local signal generated by the variable frequency oscillator to produce a UHF-IF signal with a carrier of 612 MHz. This UHF-IF signal is then subjected to a secondary conversion in which the signal is down-converted with the second local signal generated by the fixed frequency oscillator to yield a VHF-IF signal which is in accord with an unused channel out of channels 2 to 4 in the VHF band.

However, such multi-channel RF signal processing as just described is apt to result in the deterioration of the properties of the input to output isolation and of the noise figure due to the interference and due to leakage of local signals as well as due to the generation of beats and cross modulation interferences. Therefore, the realization of a stable and simplified CATV converter is desirable to avoid the just stated problems.

In the dual cable CATV system which allows the selection of signal transmission cables using a diplexer (direct current) signal, it is necessary to prevent a fall in the gain and noise figure properties due to the insertion loss caused by the d.c. signal supply line for operating the switch. On this account, a tight shield structure between compartments, decreased power loss in the input stage, enhanced stability of the first mixer, improved coupling of the primary and secondary conversion sections, and a simplified automatic mixer in the secondary conversion section are desired aims of the present invention.

SUMMARY OF THE INVENTION

Accordingly, it is an object of the present invention to provide an improved CATV converter which overcomes the foregoing prior art deficiencies.

The CATV converter of the present invention has improved operating characteristics and a simplified structure wherein, particularly the arrangement of the shielded compartments provides an enhanced isolation between the input and output. More specifically, the present CATV converter comprises at least three other compartments interposed between the compartments for generating the first and second local oscillator signals.

According to the primary aspect of the present invention, a cable switch drive signal, or d.c. signal, for switching CATV signals of a dual cable system is supplied by or from the input stage of the CATV converter. In this case, the d.c. signal is supplied from the junction of an inductor and capacitor connected in series between the input terminal and ground, whereby the insertion loss of the input CATV signal on the d.c. diplexer signal feed line is reduced and the gain noise figures or characteristics are respectively improved. As a specific example, the gain is increased by approximately 0.5 dB as compared to the direct coupling of the diplexer signal through a resistor of about 1 kΩ to the input terminal. The serially connected inductor and capacitor are used in common as components of a high-pass circuit for trapping the CB band ranging from about 20 to about 30 MHz. Accordingly, the circuit arrangement for the d.c. diplexer signal feed line can be simplified. The above-mentioned dual cable system is a system in which a d.c. signal is supplied from the CATV converter of the receiver set through its input terminal to the lead-in branch point for driving the cable selection relay.

According to the second aspect of the present invention, the double balanced mixer in the up-converter of the primary conversion section has an RF-port or terminal, a local port or terminal, and an IF-port or terminal with balanced inductors and mixer diodes coupled thereto, and stability control circuits each made up of a shunt connection of a resistor and a capacitor are disposed separately. This arrangement allows checking for the balance of the circuits at the check points provided on both control circuits for correcting the balance by choosing the load resistances individually based on the value of the potential difference between the check points.

According to the third concept of the present invention, the down-converter of the secondary conversion section is made up of a self-oscillating mixing circuit including a MOS-FET and a SAW resonator, with the first gate of the MOS-FET receiving the UHF-IF input which is the primary converted signal and providing at its drain the VHF-IF output which is the secondary converted signal. The dual gate MOS-FET is used for two purposes, as an oscillating and mixing device, and its use effectively improves the noise figure and cross modulation characteristics as well as the stability of the oscillation frequency produced by the SAW resonator. The device is also useful to decrease the number of needed parts, and thus contributes to the reduction of costs.

According to the fourth aspect of the present invention, a low-pass filter is provided in the coupling circuit between the up-converter and the down-converter for a high-frequency cutoff characteristic for the down-converted first IF signal whereby a CATV converter immune to interferences is achieved. The low-pass filter utilizes a compartment between stages and feed-through capacitors formed in its partition walls, thereby enhancing the isolation and, at the same time, eliminating high-frequency interferences. The low-pass filter features a simplified structure through the effective utilization of the compartment.

According to still another aspect of the present invention, low-pass filters are formed by interposing a cylindrical shielding space and shielded compartments in the signal transmission path. These low-pass filter structures prevent a signal leaking from the signal transmission line and also eliminate the interference of signals in different frequencies. Thus, this arrangement substantially improves the input to output isolation and also contributes to the stabilization of the characteristics of the CATV converter.

BRIEF FIGURE DESCRIPTION

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
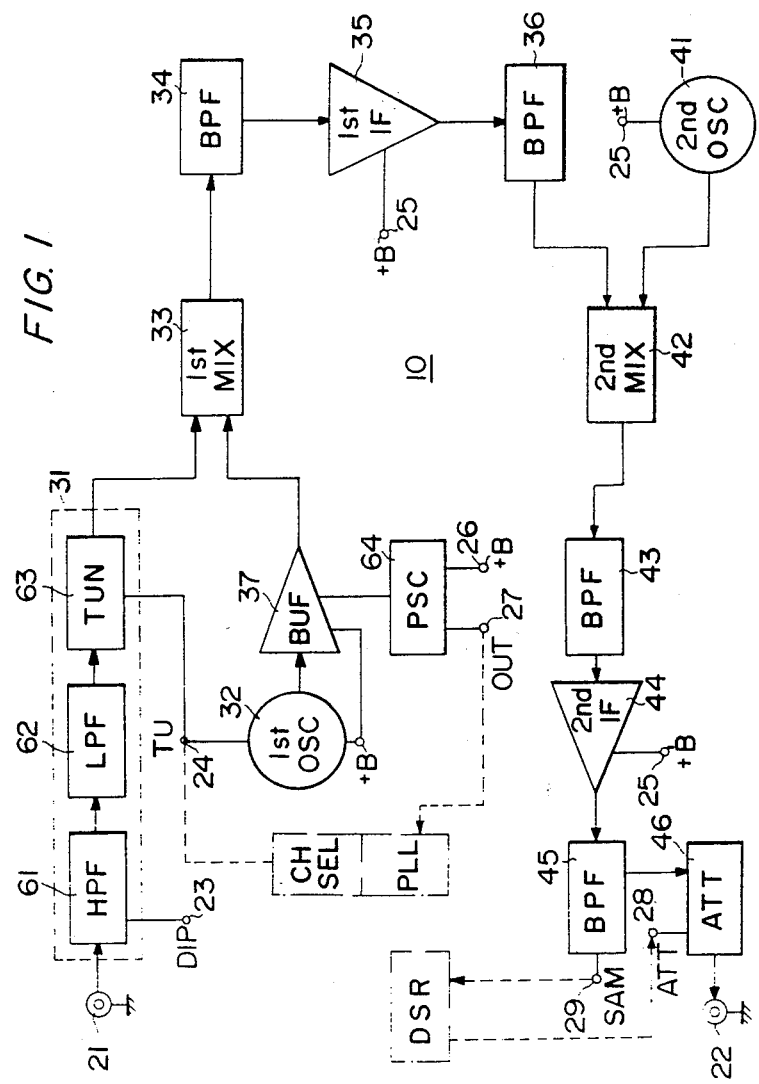
FIG. 1 is a block diagram showing the CATV converter embodying the present invention.
Figure 2:
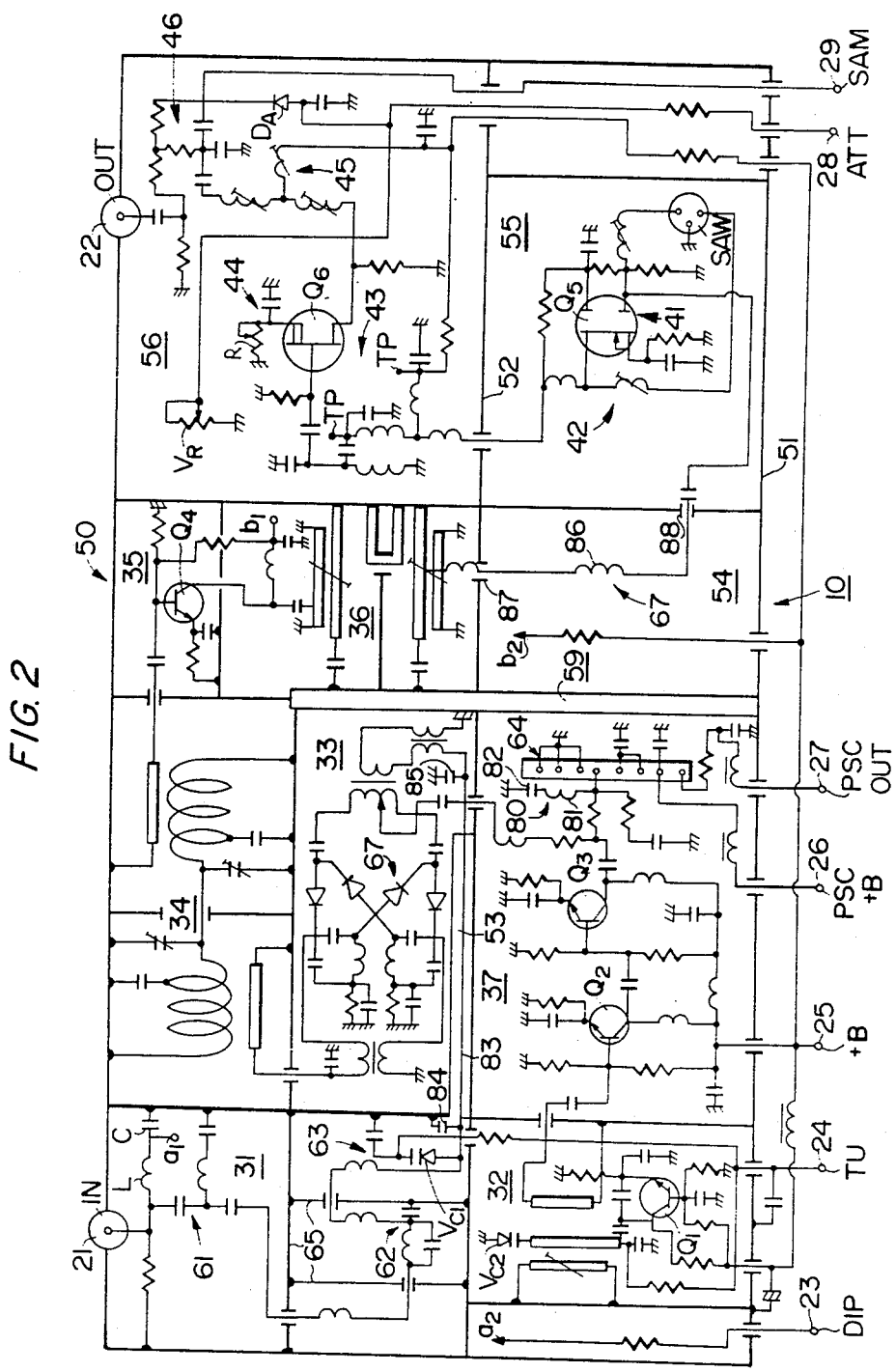
FIG. 2 is a schematic diagram of the details of the general arrangement shown in FIG. 1.

FIG. 1 shows in block form the CATV converter 10 according to the invention having an input terminal 21 and an output terminal 22 fixed to a chassis, and is further provided with control power supply terminals 23-29 shown in FIG. 2 for connecting the converter unit to external circuits. The CATV converter 10 comprises an up-converter section including an input stage 31 for selectively tuning a CATV signal, a variable frequency local oscillator stage 32 for generating a first local signal, a first mixing stage 33 for producing a primary-converted UHF-IF signal from the CATV signal and the first local signal, a first amplifier stage 35, with band-pass filters 34 and 36 provided at its input and output terminals respectively, for amplifying the UHF-IF signal, and a buffer stage 37 interposed between the variable frequency oscillator stage 32 and the first mixing stage 33. The converter 10 further comprises a down-converter section including a fixed frequency local oscillator stage 41 for generating a second local signal, a second mixing stage 42 for producing a VHF-IF signal from the UHF-IF signal and the second local signal, a second amplifier stage 44, with band-pass filters 43 and 45 provided at its input and output terminals respectively, for amplifying the secondary-converted VHF-IF signal, and an attenuation control stage 46 for controlling the output level, all enclosed within the chassis.

The input stage 31 is constructed as a subassembly including a high-pass filter (HPF) 61, low-pass filter (LPF) 62, and a variably tuned filter (TUN) 63. The input stage is built into the chassis after the input terminal 21 has been operatively secured to the chassis in a sealed manner. The subassembly of the input stage 31 is constructed as a common printed circuit wiring board which, with circuit components and shield partition walls mounted thereon, is dipped in solder, thereby leaving sufficient room for sealing the input terminal 21 as well as the output terminal 22 in the chassis. Thus, the input and output terminals 21 and 22 provide a more secure and yet economical terminal structure as compared with conventional screwed terminals.

A 1 to 256 prescaler 64 is connected to the buffer stage 37 so that part of the first local signal is extracted and fed to an external PLL circuit for stabilizing the tuning voltage produced by a channel selector (CH-SEL). The sample signal extracted at the output of the second amplifier stage 44 is supplied to an external disscrambler (DSR) for producing an attenuation signal which relieves the scramble, so that the output level is controlled by the attenuation control stage 46.

Figure 3:
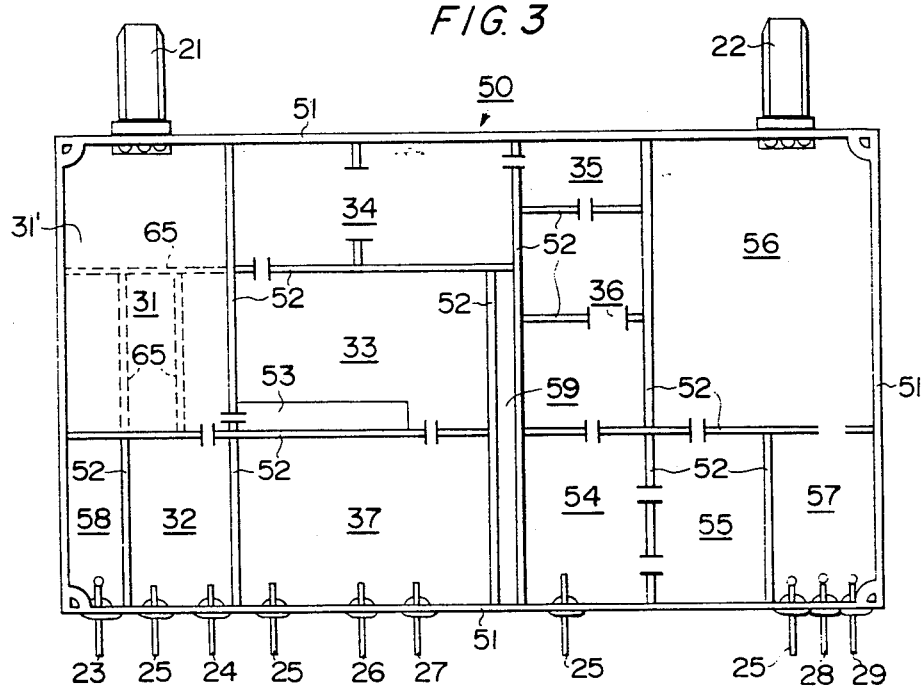
FIG. 3 is a top plan view showing the physical structure of the CATV converter shown in FIG. 2.
Figure 4:
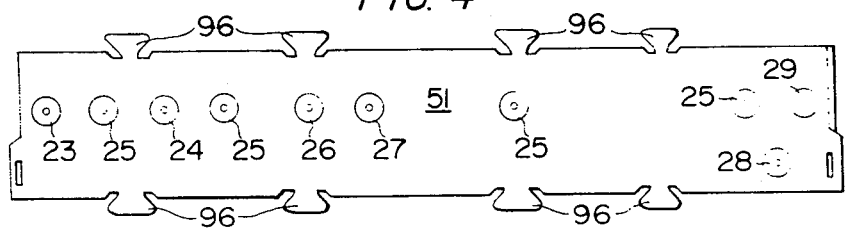
FIG. 4 is a side view of the structure shown in FIG. 3.

FIG. 2 is a schematic diagram of the CATV converter shown in FIG. 1. The converter 10 is built in the chassis 50 which is partitioned into several compartments accommodating respective stages. Terminals 21-29 for external connections are provided on one side of a frame base 51 forming the chassis 50. The input terminal 21 and output terminal 22 conducting the RF signals are sealed securely to the opposite side of the frame base 51. The subassembly method is employed for assembling the printed circuit units of each stage including the input stage, so that they are built in the chassis following the terminal sealing work. As shown in FIG. 3, the frame base 51 and intersecting partition walls 52 as shown by the bold solid lines are brazed by copper flashing to form the frame chassis 50. The feed-through terminals 23-29 are fixed in place by reflow soldering in the base section 51 of the chassis. A cylindrical shielding space 53, which is emphasized by the present invention, is placed along the partition wall of the first mixer stage 33.

The television signal transmitted over a cable has a regulated signal level of $-5$ to $+15$ dBmV at the input and does not necessitate an RF amplifier and AGC as are used in an ordinary tuner. However, in order to prevent an intermodulation and various beat interferences due to as many as 64 transmission channels, a high-pass filter is added for suppressing spurious interfering tuner frequencies below 30 MHz, particularly interference from the CB band. The low-pass filter is intended to prevent the leak of the first local oscillation into the input terminal, and it provides a transmission loss of 0.5 dB or less within the pass band.

Inside the compartment of the input stage 31, a subassembly, which is a feature of the present invention, is used. Such subassembly is constructed as a printed circuit unit incorporating the HPF 61, LPF 62 and TUN 63 including a varactor diode ($V_{cl}$) assembled with three shielding walls 65. The subassembly unit is installed in the chassis and fixed by manual soldering after the input terminal 21 has been sealed. The key feature of the input stage 31 is seen in that the diplexer d.c. signal is supplied from the junction of the front-end inductor (L) and capacitor (C) of the high-pass filter 61, and that the L-C serial connections are selected to serve as a trap circuit against the CB band, for preventing a loss of the CATV signal on the d.c. signal feed line, contributing to the improvement in the gain and noise figure, while at the same time blocking any interference by the CB band. In order to avoid the coupling of the RF signal from the d.c. signal feed line, the present invention employs a wiring system which separates the d.c. signal system from the RF signal system. This is accomplished by a horizontal shielding plate forming a wiring space in which a d.c. signal feed line a1-a2 is laid so that it is separated from the RF line. This arrangement is identical to that for another d.c. signal feed line b1-b2. The first local oscillator provides a stable output in the range of 668–1,048 MHz, and it is followed by a buffer amplifier providing an amplification of around 10 dB. The oscillator incorporates a 1/256 prescaler so that the frequency synthesizer system is employed for selecting a station. The variable frequency local oscillator stage 32 is installed in an independent compartment and comprises a resonant circuit including a variable capacitor $V_{c2}$ and an oscillation circuit including a transistor Q1. The oscillator stage 32 generates the first local oscillator signal in accordance with the tuning voltage and sends the signal through the ajacent compartment of the buffer 37 to the compartment of the first mixing stage 33. The buffer 37 comprises buffering transistors Q2 and Q3 and a prescaler 64 fabricated as an integrated circuit, which provides the outut that is derived from the first local oscillator signal the frequency of which is divided by 1/256. On the first local oscillator signal extraction side there is provided a specific frequency trap circuit 80 comprising an inductor 81 and a capacitor 82 for rejecting beat interferences. More particularly, the trap circuit is constructed to reject the interference of the ¼ frequency-division signal derived from the first local oscillator signal.

The first mixing stage 33 comprises a double balanced circuit using silicon Schottkey barrier diodes. The stage 33 provides various beat ratios of 60 dB or more within the reception band. Disposed inside the compartment of the first mixing stage 33 is a double balanced mixer 67, and a cylindrical shielding space 53 placed along the compartment wall is used for introducing the input signal which has been tuned by the input stage 31. A transmission line 83 and capacitors 84 and 85 at both ends thereof are disposed so that a pi-shaped low-pass filter is formed between the output of the input stage 31 and the input of the first mixing stage 33. Thus, for the first mixing stage 33 handling different high-frequency signals, the above mentioned cylindrical or tubular shielding space 53 is formed in a signal transmission passage connecting the compartments, and the transmission line 83 is fed through this space 53 with both ends of the line being grounded by the capacitors 84 and 85 to form the pi-type filter. This arrangement of the transmission structure effectively rejects signal interferences in a certain range of the transmission passage. In particular, the low-pass filter rejects high-frequency interfering waves for preventing interferences between signals of different frequencies. The first mixing stage 33 is formed by a DBM 67 as will be described below.

The first IF stage 35 is an important section which determines the properties of isolation between the first and second local oscillators, the cross modulations of adjacent channels and next-adjacent channels, and the noise figure of the overall converter. The band-pass filter 34 at the input of the first IF-stage 35 employs a quarter-wave helical resonator providing the performance of a power loss within 1 dB in the pass band, a −3 dB band width of 10 MHz and an attenuation of 60 dB at 100 MHz. The total attenuation is 90 dB or more in cooperation with the quarter-wave coaxial line double-tuned circuit in the following stage. The amplifying device $Q_4$ employs a DNP-structured 2SC3355 which has been developed by NEC for low-noise electronic appliances, achieving a total noise figure of 12 dB or less for the overall CATV converter.

The first IF-amplifier stage 35 is disposed in compartments adjoining the input BPF 34 and output BPF 36 each forming a double-tuned cavity, and is provided with a transistor Q4. The first amplifier 35 selectively tunes and amplifies the UHF-IF signal produced by the first mixer 33 and delivers the output to the down-conversion section in the following stage. A coupling compartment 54, which is a feature of the present invention, is disposed for the transmission of the UHF-IF signal to the following stage. An inductive transmission line 86 for the UHF-IF signal is disposed in the coupling compartment 54 so that a low pass pi-type filter 67 is formed in cooperation with feed-through capacitors 87 and 88 for transmitting the UHF-IF signal. Accordingly, the UHF-IF signal from the up-conversion section is conducted to the down-conversion section via the pi-type low-pass filter 67. The arrangement provides the improved isolation of about 90 dB or more in the D/U ratio for the UHF-IF signal against the first local oscillation signal, whereby a simplified structure for rejecting high frequency interfering waves is realized at the same time. The d.c. power voltage for driving the first IF-amplifier stage 35 is supplied through the coupling compartment 54, but the d.c. line b1-b2 is isolated from the BPF 36 by the provision of the horizontal shielding plate so as to block the coupling with the high-frequency signal system as mentioned previously.

The second local oscillator 41 determines the output frequency of the converter, and it must have a high frequency stability. The oscillator employs a SAW resonator which has been developed for frequency converters, with its satisfactory stability comparable with that of crystal resonators.

The fixed frequency local oscillator stage 41 and the second mixing stage 42 are disposed in a shared compartment 55. In this arrangement, the second local oscillator signal having a fixed frequency generated by an oscillator 41 includes a surface acoustic wave resonator SAW and an oscillation FET Q5. The UHF-IF signals from the previous stage are intermixed by the second mixing stage 42 comprising a self-oscillation mixing circuit for carrying out the secondary conversion and for providing the second local signal having a satifactory frequency stability as will be described below.

The second IF stage 44 comprises band-pass filters 43, 45, an amplifier Q6 and a video signal processing circuit 46. The amplifier Q6 is susceptible to the cross modulation with signals on adjacent channels as in the case of the second mixer 42, and the video signal processing circuit 46 must have a strong attenuation difference. To cope with the cross modulation problem, the input band-pass filter 43 employs a double tuned circuit, while a junction type FET with less 3-dimensional distortion is used for the amplifying device Q6. The FET of the amplifier Q6 includes a variable resistor R which grounds the source electrode of the FET for modifying the amplified VHF-IF signal. The attenuation circuit attenuates the output signal within 6±0.3 dB in an ON-OFF period of less than 1 μs through the adjustment of the diode bias by means of a fast switching diode $D_A$ and a trimming variable resistor VR. The total flatness of the band at the output terminal 22 is within 1.5 dB in the band from p−1.25 MHz to S+0.25 MHz.

The second amplifier stage 44 including the FET Q6 and including the BPFs 43 and 45 at its input and output respectively, shares a compartment 56 with the output video signal control or processing circuit 46. The VHF-IF signal produced by the second mixing stage 42 is tuned selectively and attenuated in a controlled manner, then set out through the output terminal 22. One feature of the compartment 56 is that the BPF 43 is formed by a double tuned circuit so that a selected frequency of the VHF-IF signal is tuned accurately. Another feature is that the attenuation voltage in the scramble operation is variable by said variable trimming resistor VR and applied forwardly to said fast switching diode $D_A$ so as to control the diode current for operating the control circuit 46. The attenuation signal is an attenuation voltage which is produced by the external disscrambler (DSR) when a non-subscriber's CATV converter is operated, thus serving as a scramble circuit for blocking the outgoing VHF-IF signal. For this purpose, the VHF-IF signal is supplied in advance through a coupling capacitor and through the sample signal terminal 29 to the external disscrambler (DSR), which in turn detects the pilot signal in the sample signal and sends the reproduced attenuation signal back to the CATV converter through the attenuation signal terminal 28. However, unless the output control stage 46 attenuates the output signal accurately in accordance with the attenuation signal, a contrast adjustment will be needed on the receiver set. This problem is solved by the control circuit 46 according to the invention comprising said fast switching diode $D_A$ and a variable resistor $V_R$.

The foregoing CATV converter is built into the chassis 50 shown in FIGS. 3 to 6. The chassis 50 is partitioned into several compartments formed by the frame base 51 and intersecting partition walls 52 inside the base. Thus, the input stage 31, the variable frequency local oscillator stage 32, the first mixing stage 33, the BPFs 34 and 36, the first amplifier stage 35, and the buffer stage 37 each have their independent compartments, and the chassis further includes the cylindrical shielding space 53, the coupling compartment 54 and the shared compartments 55 and 56. In addition, compartments 57 and 58 for accommodating external wirings and a long shielded compartment 59 formed by double shielding walls which are features of the present invention, are provided.

Figure 6:
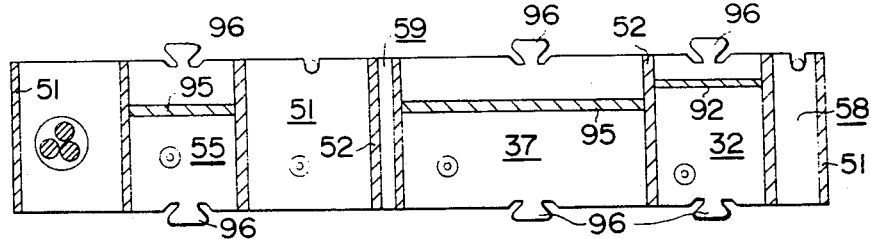
FIG. 6 is a cross-sectional view of the structure shown in FIG. 5.

FIGS. 2 and 3 show a shielded compartment 59 located in the middle of the chassis 50 between the compartment of the buffer stage 37 and the coupling compartment 54. As best seen in FIGS. 3 and 6, the compartment for the variable frequency local oscillator stage 32 and the compartment 55 for the fixed frequency local oscillator stage 41 including the self-oscillation mixing circuit 42 are located at opposite sides of the compartments 37, 59 and 54. Accordingly, the variable frequency local oscillator stages 32 and 41 are isolated from each other by three compartments, whereby interference with each other is substantially eliminated because the first and second local oscillator signals are isolated from each other. This separation is an important feature of the invention.

Figure 5:
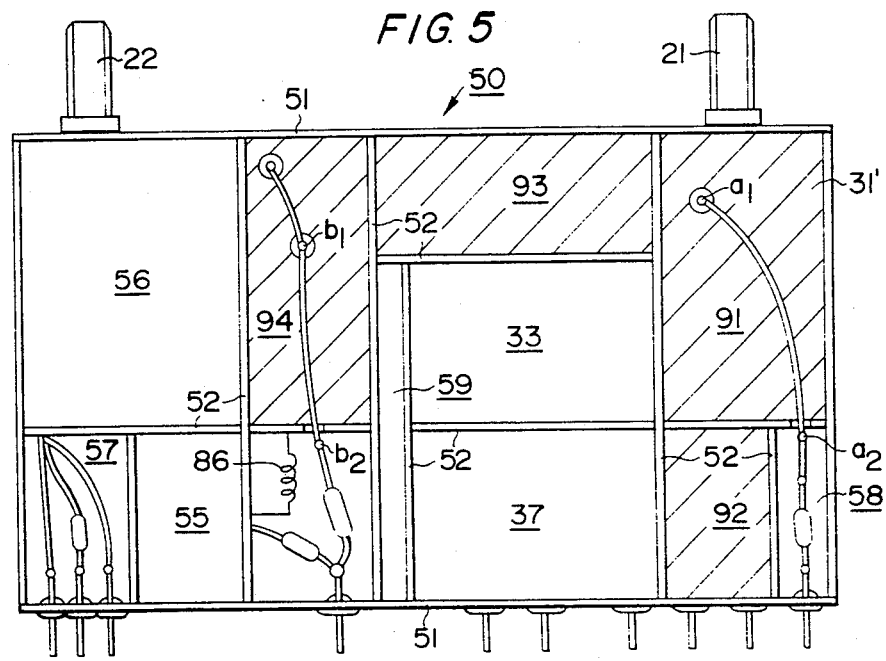
FIG. 5 is a bottom view of the structure shown in FIG. 3.
Figure 7:
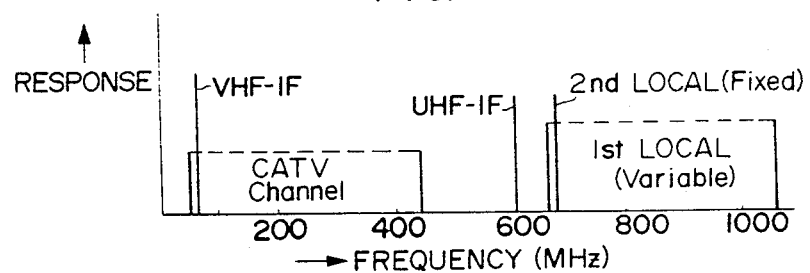
FIG. 7 is a spectrum diagram showing the frequency distribution of the signal processed by the CATV converter of the invention.

The chassis 50 accommodates circuit units within respective compartments. The input stage 31 includes a subassembly unit having shielding walls 65 as shown by the dashed lines in FIG. 3. The input stage 31 with its subassembly unit is built into a common compartment 31′. The bottom of the compartment 31′ has a horizontal shielding plate 91 as shown in FIG. 5. Similarly, horizontal shielding plates 92, 93 and 94 are provided for the compartments of the variable frequency local oscillator stage 32, of the first amplifier stage 35, and of the associated BPFs 34 and 36 respectively, for enhancing the shielding effect. Wiring for the d.c. signal system is provided on the shielding plates 91 and 94 through the initially open chassis 50 which is then closed by a shielding cover, not shown, which is placed over the openings, so that the d.c. signal system is separated from the high frequency signal system through the shielding cover, whereby interferences between compartments are eliminated. This structure appreciably contributes to the signal isolation and elimination of beat interferences.

The buffer stage 37, the first mixing stage 33 and the self-oscillation mixing circuit 42 are fabricated as subassemblies on individual printed circuit wiring boards. These boards are shown with all surface mounted parts being removed so as to clearly show the attachment structure. The frame base 50 and partition walls 52 of the chassis 50 are provided on their front and back sides with a number of fixing tabs 96, which ensure the electrical and mechanical linkage with the shielding cover which is fixed to the chassis through a shielding spacer.

Figure 8:
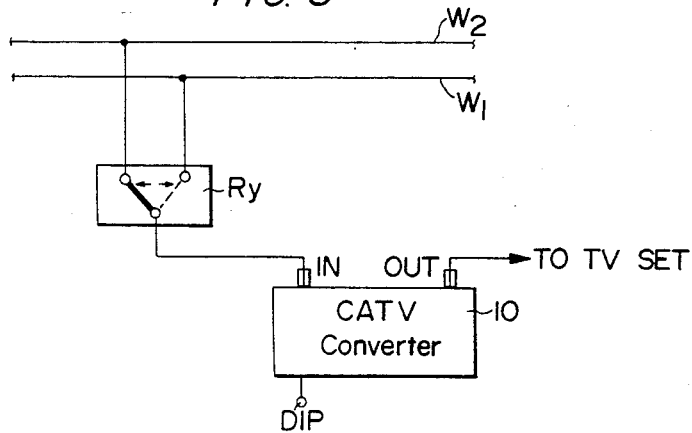
FIG. 8 shows the connection of the present CATV converter to one or the other of two transmission cables.
Figure 9:
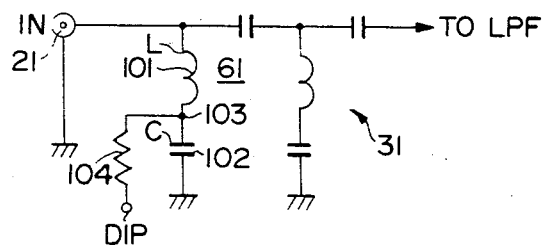
FIG. 9 is a schematic diagram showing the principal portion of the input stage of the CATV converter shown in FIG. 1.

The diplexer signal feed system in the input stage 31, the double balanced mixer constituting the first mixing stage 33 and the self-oscillation mixing circuit Q5 integrating the fixed frequency oscillator 41 and second mixer stage 42, all of which are features of the present invention, will now be described. First, the d.c. signal feed system according to the invention for the dual cable CATV reception system will be described with reference to FIGS. 8 and 9. In the dual cable CATV system, television signals are transmitted from broadcasting stations over two transmission cables W1 and W2, and the subscriber selects one of the cables at the entry terminal by operating a switching relay Ry. The relay Ry is driven by the d.c. diplexer signal which is derived from a d.c. signal applied to the DIP terminal 23 of the CATV converter 10 and supplied through the RF input terminal (IN) to the relay. The diplexer signal for driving the relay Ry is produced in accordance with the channel selection, and a problem in this case is the insertion loss of the RF input signal caused by the d.c. signal feed line. The present invention alleviates this insertion loss by utilizing the high-pass filter 61 in the input stage 31 as shown in FIG. 9, in which the diplexer signal is supplied through a resistor 104 to the junction 103 of the inductor 101 and capacitor 102. Namely, the front-end LC serial connection of the high-pass filter 61 is utilized for trapping the CB band and the diplexer signal is fed in at the junction 103 of the connection, so that the loss of the RF input signal is prevented by the inductor 101, whereby an improvement in the gain and noise figure by approximately 0.5 dB is attained.

Figure 10:
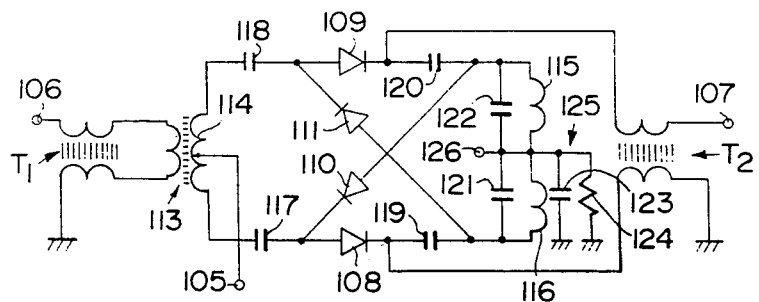
FIG. 10 is a detailed schematic diagram of the first mixer stage shown in FIG. 1.

Next, the first mixer stage 33 will be described with reference to FIGS. 10 and 11. In order to achieve a small power loss over a wide dynamic range and a satisfactory input to output isolation, a double balanced mixer (DBM) is employed. The DBM usually comprises balanced transformers T1 and T2 having an RF terminal 105, local input terminal 106 and IF terminal 107 as shown in FIG. 10. These terminals are linked through mixer diodes 108–111, balanced inductors 114–116 and capacitors 117–122. The circuit is connected to a stability control circuit 125 which comprises a shunt connection of a by-pass capacitor 123 and a load resistor 124. However, the circuit must be balanced perfectly when seen from the inductor 114 of the balanced transformer 113 to the output, and if this condition is not satisfied, the desired purpose is not accomplished. Generally, it is difficult to lay out the printed line patterns and parts symmetrically. In addition, the influence of stray capacitances and lead line inductances and the disparity of component parts further make it difficult to achieve a perfect balance. On this account, conventionally, a load resistor 124 in the stability control circuit 125 has been provided with a check point 126 to read the potential for checking the state of balance thereby to enhance the d.c. operating stability of the diode bridge. Therefore, it is desirable to have the arrangement for measuring the balance of the double balanced mixer and for readjusting the balance by replacing parts and changing the wiring as will now be described with reference to FIG. 11.

Figure 11:
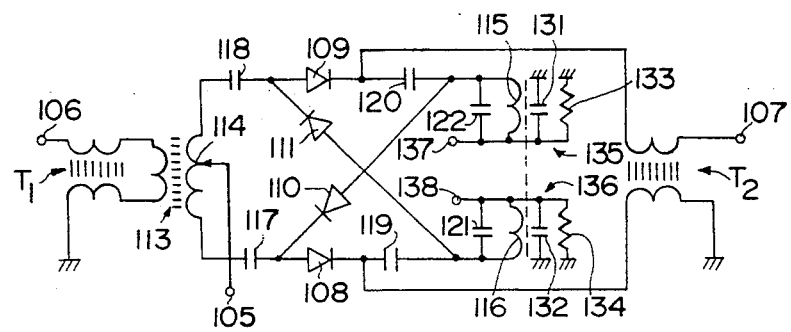
FIG. 11 is a schematic diagram showing the principal portion of the first mixer stage shown in FIG. 2.

FIG. 11 shows the improved DBM 67 in the first mixing stage 33 shown in FIG. 2, the circuit being constructed to overcome the above-mentioned prior art deficiencies. Except for the stability control circuit, the arrangement of FIG. 11 is identical to that of FIG. 10 with common reference numbers being given to the counterparts, and a detailed explanation thereof is omitted. The improved arrangement features that the balanced inductors 115 and 116 are provided with individual control circuits 135 and 136 each comprising a shunt connection of a by-pass capacitor 131 or 132 and a load resistor 133 or 134 respectively, providing two check points 137 and 138 respectively. This arrangement permits making the balance test for the inductors through the measurement of the potential difference between the check points 137 and 138, whereby the circuit can be balanced exactly by replacement of component parts or by a modification of the wiring. The precisely balanced DBM 67, when used in the first mixing stage 33, provides a low power loss and high input to output isolation over a wide dynamic range.

Figure 12:
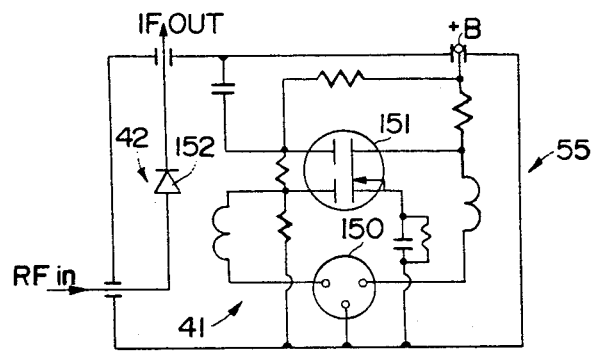
FIG. 12 is a detailed schematic diagram showing the secondary conversion section shown in FIG. 1.
Figure 13:
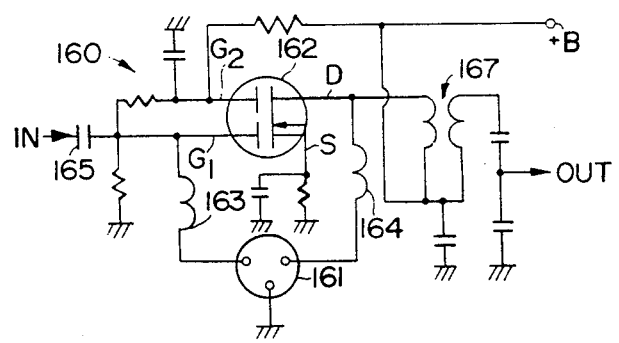
FIG. 13 is a schematic diagram of the self-oscillation and mixing circuit shown in FIG. 2.

FIGS. 12 and 13 show the detailed circuit arrangements housed in the shared compartment 55 including the fixed frequency oscillator 41 and second mixing stage 42 in the secondary conversion section. The arrangement of FIG. 12 comprises a fixed frequency oscillator 41 including a SAW resonator 150 and a FET 151, and a second mixing stage 42 including a diode 152. The second mixing stage 42 performs a secondary frequency conversion for the primary-converted UHF-IF signal by mixing it with the second local oscillator signal generated by the oscillator 41, and outputs the secondary-converted VHF-IF signal. However, such a diode mixer system is susceptible to the influence of the component layout.

FIG. 13 shows the self-oscillation mixing circuit 160 which is housed in the compartment 55 in FIG. 2. The self-oscillation mixing circuit 160 comprises a surface acoustic wave (SAW) resonator 161 and a dual-gate MOS FET 162. The MOS FET 162 has a first gate electrode G1 and a drain electrode D, between which is connected a resonant circuit including inductors 163 and 164 and the SAW resonator 161, so that a signal at a certain frequency is generated. The circuit arrangement is such that the UHF-IF signal is applied through a coupling capacitor 165 to the first gate electrode G1 of the MOS FET 162, and a frequency-converted VHF-IF signal is produced on the output drain electrode D. The MOS FET 162 is followed by an IF band-pass filter 167, and the properly frequency-converted IF signal is produced on the output terminal OUT. A d.c. power voltage +B is supplied to the FET 162 at G2, and the values of the resistors are determined so that the FET is biased properly. The use of the SAW resonator 161 stabilizes the output frequency, and the noise figure and the cross modulation characteristics are improved by the use of the FET device. Moreover, the shared use of the active element for oscillation and mixing in the form of the self-oscillation mixing circuit is advantageous for reducing the number of parts and hence the total costs.

The CATV converter arranged as described hereinabove operates as follows. In the dual cable CATV system shown in FIG. 8, the diplexer signal which has a magnitude of a few volts d.c. is conducted from the DIP terminal 23 to the input terminal 21, whereby the signal operates the switching relay Ry in the lead-in circuit to select one of the transmission cables $W_1$ or $W_2$. The CATV signal on the selected cable is introduced through the input terminal 21 into the input stage 31, fed through the HPF 61 and LPF 62, and selectively passed on channels 60–64 allocated in the frequency range of 54–440 MHz. The tuner 63 tunes a desired channel in accordance with the tuning voltage supplied on the TU terminal 24 and passes the tuned signal through the shielded transmission passage 53 to the first mixer stage 33.

The tuning voltage on the TU terminal 24 is also supplied to the resonant circuit in the oscillation stage 32, which produces the first local signal within the variable range of 668–1050 MHz. The first local signal is amplified in the buffer stage 37 and part of it is extracted by the PSC 64 and fed to the first mixing stage 33. The extracted signal is frequency divided by 1/256 by the PSC 64 and supplied to the external PLL circuit through the PSC output terminal 27. The operating voltage for the PSC 64 is supplied from the PSC power terminal 26.

The first mixing stage 33 combines the CATV signal and the first local signal using the double balanced mixer 67 to produce the UHF-IF signal of 612 MHz. The UHF-IF signal is amplified by the first amplifier stage 35 having BPFs 34 and 36 with multiple tuning cavities, and fed through the coupling compartment 54 to the conversion circuit in the stage 41, 42.

The oscillator stage 41 in the compartment 55 generates the second local oscillator signal of a fixed frequency so as to produce the output IF signal of a certain frequency, i.e., a VHF-IF frequency on any of channels 2, 3 and 4 in the U.S. channel system, and then the second local signal is combined with the UHF-IF signal by the second mixing stage 42 to obtain the desired VHF-IF signal. The output of the second mixing stage 42 is fed to the second amplifier stage 44 having the BPFs 43 and 45 in the compartment 56. Part of the amplified VHF-IF signal is extracted as a sample signal and supplied through the SAM terminal 29 to the external disscrambler (DSR), in which the pilot signal in the sample signal is detected. The disscrambler (DSR) provides an attenuation signal which is sent back through the ATT terminal 28 to the output signal control stage 46. The VHF-IF signal is fed through the attenuation circuit in the control stage 46, and then sent out through the output terminal 22 to the tuner of a television set, not shown.

The performance of the CATV converter according to the present invention is as follows:

| | |
|---|---|
| Reception system: | Double superheterodyne |
| Receiving channels: | ch. 2 to ch. 59 (54–440 MHz) |
| Converted channels: | ch. 2, ch. 3, and ch. 4 (specified) |
| Selection system: | PLL freq. synthesized tuning |
| Video process system: | Output voltage attenuation |
| Input impedance: | 75Ω, unbalanced, F-type connector |
| Output impedance: | 75Ω, unbalanced, F-type connector |
| 1st IF frequency: | 612.75 MHz (P), 608.25 MHz (S) |
| Prescaler: | 1/256 |
| Power gain: | 3 ± 2 dB |
| Flatness (P−1.25 to S+0.25): | 1.2 dB |
| Noise Figure: | 11.5 dB |
| Input return loss: | 10 dB |
| Output return loss: | 18 dB |
| 2nd OSC accuracy: | ±80 kHz |
| Input OSC leakage: | −25 dBmV |
| Output OSC leakage: | −40 dBmV |
| Tuning voltage (2-59 ch.): | 4-19 volts |
| Residual FM: | 8 kHz |
| Cross modulation: | −65 dB |
| Composite triple beat: | −70 dB |
| In band beat: | −65 dB |
| Spurius Lo intermodulation: | −40 dB |
| Input-Output isolation: | 80 dB |
| Spurius out of band: | −60 dB |
| Input dynamic range: | +25 dBmV |
| Prescaler output level: | 2 volts |
| Prescaler harmonic level: | −25 dB |
| Output ATT level: | 6 ± 0.3 dB |
| Diode ATT turn-on time: | 0.8 μs |
| RF sample level: | −3 dB |
| Power Voltages | |
| B voltage: | +24 volts |
| Prescaler B voltage: | +5 volts |
| Attenuator voltage: | 0 volt (OFF), +12 volts (ON) |
| Tuning voltage: | 3-20 volts |
| Operating temperature: | 0° to +70° C. |
| Weight: | 430 grams |

Although the invention has been described with reference to specific example embodiments, it will be appreciated, that it is intended to cover all modifications and equivalents within the scope of the appended claims.

What is claimed is:

1. A CATV converter of a dual frequency conversion type comprising an input terminal and an output terminal, an input stage (31) for tuning to a desired channel of CATV signals supplied to said input terminal (21), a variable frequency local oscillator stage for generating a first local oscillator signal, a buffer stage for said first local oscillator signal, a first mixing stage (33) connected to said local oscillator stage and to said input stage (31) for converting said selected CATV signal into a UHF-IF signal using said first local oscillator signal, said first mixing stage comprising a cylindrical shielding member arranged along a partition wall and a low-pass filter means including a transmission line so that the selected signal from said input stage is coupled to said first mixing stage through said low-pass filter means and through said transmission line inside said cylindrical shielding member, a first amplifier stage (35) connected for amplifying and selectively conditioning said UHF-IF signal provided by said first mixing stage (33), a fixed frequency oscillator stage (41) for generating a second local oscillator signal, a second mixing stage (42) for converting said UHF-IF signal provided by said first amplifier stage (35) into a VHF-IF signal using said second local oscillator signal of a certain frequency, a second amplifier stage (44) connected for amplifying said VHF-IF signal provided by said second mixing stage (42), and an output signal control stage (45, 46) connected for attenuating and controlling said VHF-IF signal provided by said second amplifier stage (44) and for supplying said attenuated VHF-IF signal to said output terminal (22), said converter further comprising shielding compartments in which said stages between said input and output terminals are disposed, said shielding compartments comprising a frame base and intersecting partition walls within said frame base, and wherein said shielding compartments include separate shielding compartments (32, 55) for the respective local oscillator circuits, and a shielding compartment (37) for said buffer stage for said first local oscillator signal, a shielding compartment (59) formed by dual shielding walls, and a coupling compartment (54) for said UHF-IF signal, said last mentioned three compartments (37, 59, 54) being interposed between said compartments for said variable frequency local oscillator stage (32) and said fixed frequency local oscillator stage (41) for enhancing the isolation between said input and output terminals (21, 22).

2. The CATV converter of claim 1, wherein said input stage (31) comprises high-pass filter means, and input signal path means, said input terminal (21) being connected directly within said input stage (31) to said high-pass filter means comprising an inductor and a capacitor connected in series between said input signal path means and a grounded partition wall, and means connected for supplying a d.c. signal to the junction of said inductor and capacitor so that said d.c. signal is fed through said inductor and led out through said input terminal (21).

3. The CATV converter of claim 2, further comprising switching means (Ry) responsive to a diplexer signal in said d.c. signal for switching CATV between cables of a plurality of CATV broadcasting systems.

4. The CATV converter of claim 1, wherein said buffer stage includes a prescaler located between said variable frequency local oscillator stage and said first mixing stage, said prescaler having a trap circuit acting on a quarter frequency of the buffer input.

5. The CATV converter of claim 1, wherein said second mixing stage and said fixed frequency local oscillator stage are formed as a self-oscillation mixing circuit comprising a dual-gate FET and a SAW resonator disposed in a shared compartment, said dual-gate FET having a first gate electrode used to receive said UHF-IF signal and a drain electrode used to provide said output VHF-IF signal.

6. The CATV converter of claim 1, further comprising feed-through capacitors in at least one of said partition walls, and wherein said compartment for conducting said UHF-IF signal from said first amplifier stage to said second mixing stage is arranged as an inductive transmission passage which forms a pi-type filter acting on said UHF-IF signal in cooperation with said feedthrough capacitors formed in respective partition walls.

7. The CATV converter of claim 1, wherein said second amplifier stage comprises a FET amplifying device and a double tuned coupling circuit on the input side of said second amplifier stage, said double tuned coupling circuit tuning a VHF-IF signal from said second mixing stage and coupling the tuned signal to said FET amplifying device in said second amplifier stage.

8. The CATV converter of claim 1, wherein said second amplifier stage comprises a junction type FET device including a variable resistor for grounding the source electrode of said FET device so that the output level of the amplified VHF-IF signal is modified.

9. The CATV converter of claim 1, wherein said input and output terminals are disposed apart from each other on one side of said frame base which comprises a front side and d.c. power line terminals disposed on said front side, whereby a wiring system for said d.c. power line terminals is separated from a wiring system of said input and output terminals by conductive partition plates.

10. The CATV converter of claim 1, wherein said input stage is a prefabricated subassembly unit including a single printed circuit wiring board comprising component parts for a high-pass filter, a low-pass filter, a tuner mounted thereon, and shielding partition plates, said subassembly unit being built in said input stage compartment after said input terminal has been secured and sealed in a predetermined position on said frame base.

11. A CATV converter of a dual frequency conversion type, comprising an input terminal and an output terminal, an input stage (31) for tuning to a desired channel of CATV signals supplied to said input terminal (21), a variable frequency local oscillator stage for generating a first local oscillator signal, a buffer stage for said first local oscillator signal, a first mixing stage (33) connected to said local oscillator stage and to said input stage (31) for converting said selected CATV signal into a UHF-IF signal using said first local oscillator signal, a first amplifier stage (35) connected for amplifying and selectively conditioning said UHF-IF signal provided by said first mixing stage (33), a fixed frequency oscillator stage (41) for generating a second local oscillator signal, a second mixing stage (42) for converting said UHF-IF signal provided by said first amplifier stage (35) into a VHF-IF signal using said second local oscillator signal of a certain frequency, a second amplifier stage (44) connected for amplifying said VHF-IF signal provided by said second mixing stage (42), and an output signal control stage (45, 46) connected for attenuating and controlling said VHF-IF signal provided by said second amplifier stage (44) and for supplying said attenuated VHF-IF signal to said output terminal (22), said converter further comprising shielding compartments in which said stages between said input and output terminals are disposed, said shielding compartments comprising a frame base and intersecting partition walls within said frame base, and wherein said shielding compartments include separate shielding compartments (32, 55) for the respective local oscillator circuits, and a shielding compartment (37) for said buffer stage for said first local oscillator signal, a shielding compartment (59) formed by dual shielding walls, and a coupling compartment (54) for said UHF-IF signal, said last mentioned three compartments (37, 59, 54) being interposed between said compartments for said variable frequency local oscillator stage (32) and said fixed frequency local oscillator stage (41) for enhancing the isolation between said input and output terminals (21, 22), and wherein said input and output terminals are disposed apart from each other on one side of said frame base which comprises a front side and d.c. power line terminals disposed on said front side, whereby a wiring system for said d.c. power line terminals is separated from a wiring system of said input and output terminals by conductive partition plates.

12. A CATV converter of a dual frequency conversion type comprising an input terminal and an output terminal, an input stage (31) for tuning to a desired channel of CATV signals supplied to said input terminal (21), a variable frequency local oscillator stage for generating a first local oscillator signal, a buffer stage for said first local oscillator signal, a first mixing stage (33) connected to said local oscillator stage and to said input stage (31) for converting said selected CATV signal into a UHF-IF signal using said first local oscillator signal, a first amplifier stage (35) connected for amplifying and selectively conditioning said UHF-IF signal provided by said first mixing stage (33), a fixed frequency oscillator stage (41) for generating a second local oscillator signal, a second mixing stage (42) for converting said UHF-IF signal provided by said first amplifier stage (35) into a VHF-IF signal using said second local oscillator signal of a certain frequency, a second amplifier stage (44) connected for amplifying said VHF-IF signal provided by said second mixing stage (42), and an output signal control stage (45, 46) connected for attenuating and controlling said VHF-IF signal provided by said second amplifier stage (44) and for supplying said attenuated VHF-IF signal to said output terminal (22), said converter further comprising shielding compartments in which said stages between said input and output terminals are disposed, said shielding compartments comprising a frame base and intersecting partition walls within said frame base, and wherein said shielding compartments include separate shielding compartments (32, 55) for the respective local oscillator circuits, and a shielding compartment (37) for said buffer stage for said first local oscillator signal, a shielding compartment (59) formed by dual shielding walls, and a coupling compartment (54) for said UHF-IF signal, said last mentioned three compartments (37, 59, 54) being interposed between said compartments for said variable frequency local oscillator stage (32) and said fixed frequency local oscillator stage (41) for enhancing the isolation between said input and output terminals (21, 22), and wherein said second mixing stage (42) and said fixed frequency local oscillator stage (41) are formed as a self-oscillation mixing circuit comprising a dual-gate FET and a SAW resonator disposed in a shared compartment, said dual-gate FET having a first gate electrode used to receive said UHF-IF signal and a drain electrode used to provide said output VHF-IF signal.

* * * * *

UNITED STATES PATENT AND TRADEMARK OFFICE
CERTIFICATE OF CORRECTION

PATENT NO. : 4,569,084
DATED : February 4, 1986
INVENTOR(S) : Masaaki Takahama

It is certified that error appears in the above—identified patent and that said Letters Patent is hereby corrected as shown below:

in [30] Foreign Application Priority Data the date of the

Japanese Patent 58-181556 should read: --September 28, 1983--.

Signed and Sealed this

Thirteenth Day of May 1986

[SEAL]

Attest:

DONALD J. QUIGG

Attesting Officer

Commissioner of Patents and Trademarks